United States Patent
Chen et al.

(10) Patent No.: US 8,907,453 B2
(45) Date of Patent: Dec. 9, 2014

(54) PARASITIC LATERAL PNP TRANSISTOR AND MANUFACTURING METHOD THEREOF

(71) Applicant: Shanghai Hua Nec Electronics Co., Ltd., Shanghai (CN)

(72) Inventors: Fan Chen, Shanghai (CN); Xiongbin Chen, Shanghai (CN); Kai Xue, Shanghai (CN); Keran Xue, Shanghai (CN); Jia Pan, Shanghai (CN); Hao Li, Shanghai (CN); Ying Cai, Shanghai (CN); Xi Chen, Shanghai (CN)

(73) Assignee: Shanghai Hua Nec Electronics Co., Ltd., Shanghai (CN)

( * ) Notice: Subject to any disclaimer, the term of this patent is extended or adjusted under 35 U.S.C. 154(b) by 14 days.

(21) Appl. No.: 13/677,577

(22) Filed: Nov. 15, 2012

(65) Prior Publication Data
US 2013/0119384 A1    May 16, 2013

(30) Foreign Application Priority Data
Nov. 16, 2011    (CN) .......................... 2011 1 0363181

(51) Int. Cl.
| | | |
|---|---|---|
| *H01L 29/735* | (2006.01) | |
| *H01L 29/73* | (2006.01) | |
| *H01L 29/04* | (2006.01) | |
| *H01L 29/66* | (2006.01) | |
| *H01L 29/10* | (2006.01) | |
| *H01L 29/06* | (2006.01) | |
| *H01L 29/45* | (2006.01) | |

(52) U.S. Cl.
CPC .............. *H01L 29/73* (2013.01); *H01L 29/456* (2013.01); *H01L 29/735* (2013.01); *H01L 29/04* (2013.01); *H01L 29/66234* (2013.01); *H01L 29/1008* (2013.01); *H01L 29/6625* (2013.01); *H01L 29/0649* (2013.01)
USPC .................... 257/575; 257/576; 257/E29.187

(58) Field of Classification Search
CPC ........................ H01L 29/6625; H01L 29/735
USPC ................. 257/575, 576, E29.187, E21.373, 257/E21.609
See application file for complete search history.

(56) References Cited

U.S. PATENT DOCUMENTS

| | | | | |
|---|---|---|---|---|
| 5,273,913 | A * | 12/1993 | Divakaruni et al. | 438/337 |
| 5,387,553 | A * | 2/1995 | Moksvold et al. | 438/339 |
| 5,624,856 | A * | 4/1997 | Li et al. | 438/339 |
| 7,932,581 | B2 * | 4/2011 | Yang et al. | 257/565 |

(Continued)

*Primary Examiner* — Thao X Le
*Assistant Examiner* — J. R. Oakley
(74) *Attorney, Agent, or Firm* — MKG, LLC

(57) ABSTRACT

A parasitic lateral PNP transistor is disclosed, in which, an N-type implanted region formed in each of two adjacent active regions forms a base region; a P-type doped polysilicon pseudo buried layer located under a shallow trench field oxide region between the two active regions serves as an emitter; and a P-type doped polysilicon pseudo buried layer located under each of the shallow trench field oxide regions on the outer side of the active regions serves as a collector region. The transistor has a C-B-E-B-C structure which alters the current path in the base region to a straight line, which can improve the current amplification capacity of the transistor and thus leads to a significant improvement of its current gain and frequency characteristics, and is further capable of reducing the area and increasing current intensity of the transistor. A manufacturing method of the parasitic lateral PNP transistor is also disclosed.

15 Claims, 4 Drawing Sheets

(56) References Cited

U.S. PATENT DOCUMENTS

| | | | |
|---|---|---|---|
| 2006/0027895 A1* | 2/2006 | Chatterjee | 257/592 |
| 2010/0213575 A1* | 8/2010 | Chen et al. | 257/575 |
| 2010/0289058 A1* | 11/2010 | Yang et al. | 257/137 |
| 2011/0140239 A1* | 6/2011 | Chiu et al. | 257/565 |
| 2013/0075746 A1* | 3/2013 | Mallikarjunaswamy et al. | 257/75 |

* cited by examiner

PARASITIC LATERAL PNP TRANSISTOR AND MANUFACTURING METHOD THEREOF

CROSS-REFERENCES TO RELATED APPLICATIONS

This application claims the priority of Chinese patent application number 201110363181.0, filed on Nov. 16, 2011, the entire contents of which are incorporated herein by reference.

TECHNICAL FIELD

The present invention pertains to the fabrication of semiconductor integrated circuits, and more particularly, to a parasitic lateral PNP transistor. This invention also relates to a method of manufacturing the parasitic lateral PNP transistor.

BACKGROUND

In Radio Frequency (RF) applications, higher and higher characteristic frequencies of the device are being required. Although RFCMOSs (Radio-Frequency Complementary Metal-Oxide Semiconductors) can realize higher characteristic frequencies in advanced technologies, they can hardly reach characteristic frequencies higher than 40 GHz and always lead to high costs in development of advanced technologies. For this reason, devices such as RFCMOSs made in advanced technologies are not able to completely meet the RF requirements. Although devices made by using compound semiconductors can realize extremely high characteristic frequencies, they have disadvantages of high cost of materials and small sizes. Besides, most of the compound semiconductors are toxic. Therefore, their applications are limited. In contrary, SiGe (Silicon-Germanium) HBTs (Heterojunction Bipolar Transistors) are good choices for, as well as the mainstream of, ultra-high-frequency devices for the following reasons. Firstly, they take advantage of the difference between energy bands of strained SiGe and strained Si to generate a strain effect, which can alter properties of materials, thereby improving carriers injection efficiency of emitter-region and thus increasing the current magnification of the device. Secondly, a lower base resistance and a higher characteristic frequency can be achieved through a heavily doped SiGe base region. Thirdly, the SiGe process is basically compatible with the silicon process. Based on the above merits, output devices are required to have better performances, such as a higher current gain (no less than 15) and a higher cut-off frequency (no less than 1 GHz).

In existing silicon-germanium (SiGe) heterojunction bipolar transistors (HBTs), a heavily doped collector buried layer is formed to lower the collector resistance and deep trench isolations are formed to reduce a parasitic capacitance between the collector region and the substrate, so as to improve their frequency characteristics. The existing SiGe HBTs can adopt a parasitic lateral PNP structure. FIG. 1 is an electrical schematic diagram of an existing parasitic lateral PNP transistor, in which the base, emitter and collector are connected to the base, emitter and collector regions, respectively. Although the fabrication process for the existing parasitic lateral PNP transistor is mature and reliable, it still has shortcomings, mainly as follows: 1) an L-shaped path for the base current Ic results in poor current amplification capacity and poor frequency characteristics of the device; 2) the feature of picking up the base region from a side of the device results in the increase of the device area; 3) the collector region is formed by using an epitaxial growing process which has a high costs; 4) the adopted deep trench isolation process is complex and has a relatively high cost.

SUMMARY OF THE INVENTION

The objective of the present invention is to provide a parasitic lateral PNP transistor to increase the current gain, improve the frequency characteristics and reduce the area of the device. To this end, the present invention also provides a manufacturing method of the parasitic lateral PNP transistor.

To achieve the above objective, the present invention provides a parasitic lateral PNP transistor which includes: a P-type substrate; three shallow trench field oxide regions formed in the substrate; two active regions, each being located between two adjacent ones of the three shallow trench field oxide regions; two base regions, each being formed of an N-type implanted region located in one of the two active regions, the N-type implanted regions in the two active regions extending downward and laterally under bottoms of the shallow trench field oxide regions such that the N-type implanted regions in the two active regions are joined together to form an N-type implanted layer; an N-type polysilicon layer formed on a top of each of the active regions and contacting with a corresponding base region; and a polysilicon pseudo buried layer formed under each of the shallow trench field oxide regions and having a P-type impurity doped therein, the P-type impurity diffusing to a boundary portion of the polysilicon pseudo buried layer to form a P-type doped region, each polysilicon pseudo buried layer and its corresponding P-type doped region being surrounded by and contacting with the N-type implanted layer, wherein the polysilicon pseudo buried layer and the P-type doped region under a bottom of a middle one of the shallow trench field oxide regions jointly serve as an emitter region, and the polysilicon pseudo buried layer and the P-type doped region under a bottom of each of the shallow trench field oxide regions adjacent to the middle shallow trench field oxide region jointly serve as a collector region.

According to a preferred embodiment, the width of the polysilicon pseudo buried layer is smaller than or equal to that of the bottom of the shallow trench field oxide region, and the width of the polysilicon pseudo buried layer is 0.05 µm to 0.3 µm.

According to a preferred embodiment, the distance between the emitter region or the collector region and the top of the base region is determined by the depth of the bottom of the shallow trench field oxide region which is 0.3 µm to 0.5 µm.

According to a preferred embodiment, the distance between the emitter region and the collector region is determined by the electric requirements for the parasitic lateral PNP transistor and is ranged from 0.4 µm to 2 µm.

According to a preferred embodiment, the parasitic lateral PNP transistor further includes: a metal contact formed on the top of each N-type polysilicon layer to pick up a base; a first deep hole contact formed in the shallow trench field oxide region that is located on the top of the emitter region, the first deep hole contact contacting with the emitter region to pick up an emitter; and a second deep hole contact formed in each of the shallow trench field oxide regions that are located on top of the collector regions, the second deep hole contact contacting with its corresponding collector region to pick up a collector.

To achieve the above objective, the present invention also provides a method of manufacturing parasitic lateral PNP transistor. The method includes:

providing a P-type substrate;

etching the P-type substrate to form three shallow trenches therein, every adjacent two of the shallow trenches isolating an active region therebetween;

forming a groove at a bottom of each of the shallow trenches;

filling polysilicon into each groove to form a polysilicon pseudo buried layer therein;

implanting a P-type impurity into each polysilicon pseudo buried layer such that the P-type impurity diffuses to a boundary portion of the polysilicon pseudo buried layer and thereby forms a P-type doped region, wherein the polysilicon pseudo buried layer and the P-type doped region under a bottom of a middle one of the shallow trench field oxide regions jointly serve as an emitter region, and the polysilicon pseudo buried layer and the P-type doped region under a bottom of each of the shallow trench field oxide regions adjacent to the middle shallow trench field oxide region jointly serve as a collector region;

filling an oxide into each of the shallow trenches to form a shallow trench field oxide region therein;

implanting an N-type impurity into each active region such that the implanted N-type impurity reaches a depth greater that that of a bottom of the shallow trench field oxide region and laterally diffuses under bottoms of the shallow trench field oxide regions so as to form an N-type implanted layer, wherein a portion of the N-type implanted layer that is situated within any one of the active regions serves as a base region; and forming an N-type polysilicon layer on a top of each active region.

This invention has the following benefits.

1. The transistor of the present invention adopts a C-B-E-B-C structure, namely a structure of first collector-first base-emitter-second base-second collector, which changes the current path in the base region from the existing L-shape to a straight line, so as to improve the transistor's current amplification capacity and thus lead to a significant improvement of its current gain and frequency characteristics.

2. In the transistor of the present invention, the emitter region and the collector regions are formed at the bottoms of the shallow trench field oxide regions; each base is located between the emitter region and one of the collector regions and is picked up from a top of its corresponding active region. By adopting such a structure, the whole area of the device is reduced and the current intensity of the device is increased.

3. The present invention adopts P-type polysilicon pseudo buried layers to form the emitter region and the collector regions of the transistor. As polysilicon has a high diffusion coefficient and diffuses evenly, the contact resistance (Rc) between the emitter region and collector regions is reduced and is more uniformly distributed, thus the cut-off frequency of the transistor is greatly improved.

4. The deep-hole contact process adopted in the fabrication of the transistor of the present invention can further lead to the reduction of device area and the improvement of frequency characteristics.

BRIEF DESCRIPTION OF THE DRAWINGS

The present invention will be described and specified below with reference to accompanying drawings and exemplary embodiments.

DETAILED DESCRIPTION

Figure 1:
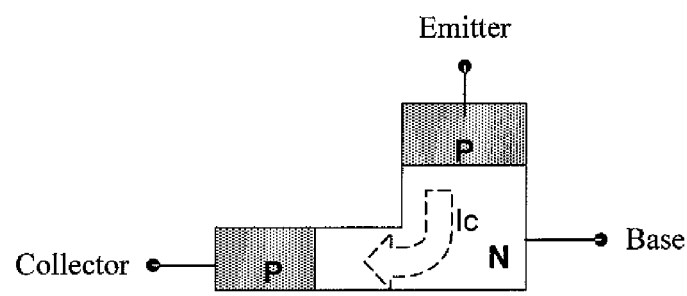
FIG. 1 is an electrical schematic diagram of an existing parasitic lateral PNP transistor.
Figure 2:
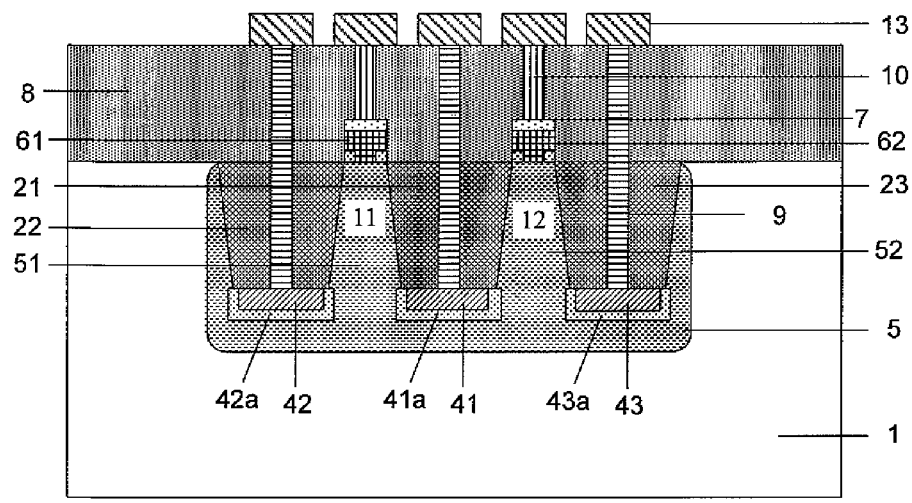
FIG. 2 is a schematic illustration of the structure of a parasitic lateral PNP transistor according to an embodiment of the present invention.

FIG. 2 is a schematic illustration of the structure of a parasitic lateral PNP transistor according to an embodiment of the present invention. In this embodiment, the parasitic lateral PNP transistor of the present invention includes a P-type substrate 1 and two active regions, namely a first active region 11 and a second active region 12. The first active region 11 and the second active region 12 are isolated by three shallow trench field oxide regions. In other words, the structure formed for isolating the active regions is shallow trench isolations (STIs). The shallow trench field oxide region located between the first active region 11 and the second active region 12 is a first shallow trench field oxide region 21, while those located on the outer side of the first active region 11 and the second active region 12 are a second trench field oxide region 22 and a third shallow trench field oxide region 23, respectively. A depth of the bottom of each of the shallow trench field oxide regions 21 to 23 is 0.3 µm to 0.5 µm.

The parasitic lateral PNP transistor further includes base regions 51 and 52 formed of N-type implanted regions located in the first active region 11 and the second active region 12, respectively. The N-type implanted regions in the first active region 11 and the second active region 12 both extend downward and laterally under bottoms of the shallow trench field oxide regions 21 to 23 such that they are connected together and thereby form an N-type implanted layer 5. The N-type implanted layer 5 may be formed by using the collector ion implantation process or the N-type well ion implantation process of the NPN transistor process under conditions as follows: the implantation dose is 1e11 cm$^{-2}$ to 1e13 cm$^2$; the implantation energy is 200 KeV to 1000 KeV; and the implanted N-type impurity is phosphorus or arsenic.

The parasitic lateral PNP transistor further includes a first N-type polysilicon layer 61 formed on the top of the first active region 11 and a second N-type polysilicon layer 62 formed on the top of the second active region 12. The first N-type polysilicon layer 61 and the second N-type polysilicon layer 62 contact with a corresponding base region 51 and 52. A metal contact 10 is formed on the top of each of the first N-type polysilicon layer 61 and the second N-type polysilicon layer 62 to pick up a first base and a second base, respectively. The N-type polysilicon layers 61 and 62 may be formed by using the emitter polysilicon process of the NPN transistor process. The impurity doped to form the N-type polysilicon layers 61 and 62 is phosphorus or arsenic, which may be implanted by an in-situ doping process or by first growing a non-doped polysilicon layer and then doping it by an ion implantation process. The implantation dose for forming the N-type polysilicon layers 61 and 62 may be 1e15 cm$^{-2}$ to 1e16 cm$^{-2}$. Optionally, a metal silicide 7 is further formed on the surface of each of the N-type polysilicon layers 61 and 62.

A groove is formed at the bottom of each of the first shallow trench field oxide region 21, the second shallow trench field oxide region 22 and the third shallow trench field oxide region 23. A width of each of the grooves is smaller than or equal to that of the bottom of each shallow trench, and the width of each of the grooves is 0.05 µm to 0.3 µm. These grooves are filled with polysilicon to form polysilicon pseudo buried layers 41 to 43, each having a thickness equal to the depth of the grooves.

The polysilicon pseudo buried layers 41 to 43 are doped with a P-type impurity, the P-type impurity further diffuses into respective boundary portions of the substrate that surround the polysilicon pseudo buried layers and thereby forms P-type doped regions 41a to 43a. Both the polysilicon pseudo buried layers 41 to 43 and the P-type doped regions 41a to 43a are surrounded by and contact with the N-type implanted layer 5. The implantation dose for forming the P-type doped regions 41a to 43a is 5e14 cm$^{-2}$ to 5e15 cm$^{-2}$ and the implantation energy is 3 KeV to 30 KeV, and the implanted impurity is boron or boron fluoride.

The polysilicon pseudo buried layer 41 and the P-type doped region 41a, located under the first shallow trench field oxide region 21, jointly form an emitter region. A deep hole contact 9 is formed in the first shallow trench field oxide region 21 that is located on the top of the emitter region. Moreover, the deep hole contact 9 contacts with the emitter region and picks up an emitter.

The polysilicon pseudo buried layer 42 and the P-type doped region 42a, located under the second shallow trench field oxide region 22, jointly form a first collector region, and a deep hole contact 9 is formed in the second shallow trench field oxide region 22 and contacts with the first collector region, and thereby picks up a first collector. The polysilicon pseudo buried layer 43 and the P-type doped region 43a, located under the third shallow trench field oxide region 23, jointly form a second collector region, and a deep hole contact 9 is formed in the third shallow trench field oxide region 23 and contacts with the second collector region, and thereby picks up a second collector. The distance between the emitter region and any one of the collector regions is determined by the electric requirements for the parasitic lateral PNP transistor and is ranged from 0.4 µm to 2 µm.

Each of the metal contacts 10 is formed through an interlayer film 8 and is connected with its corresponding metal wire 13 at the top of the device. On the other hand, the deep hole contacts 9 are formed through the respective shallow trench field oxide regions and the interlayer film 8 and are connected to the corresponding metal wires 13, and thereby enable the connection of the emitter, base and collector via the metal wires 13.

Figure 8:
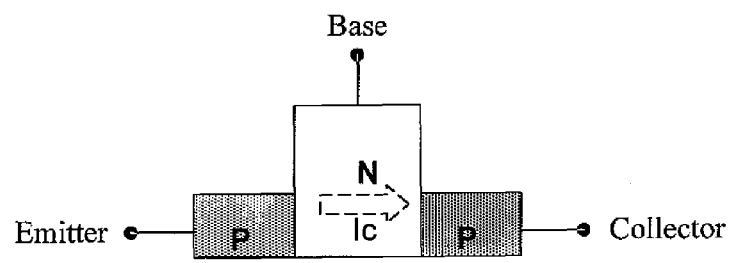
FIG. 8 is an electrical schematic diagram of the parasitic lateral PNP transistor according to an embodiment of the present invention.

FIG. 8 is an electrical schematic diagram of the parasitic lateral PNP transistor according to this embodiment of the present invention. As shown in the figure, as the transistor in this embodiment adopts a C-B-E-B-C structure, namely the first collector-first base-emitter-second base-second collector structure, the current path in the base region is altered from the existing L-shape to a linear shape which can improve the transistor's current amplification capacity and thus leads to a significant improvement of its current gain and frequency characteristics.

FIGS. 3 to 7 schematically illustrate structures of the parasitic lateral PNP transistor in respective steps of a manufacturing method according to the embodiment of the present invention. The manufacturing method of the parasitic lateral PNP transistor includes the following steps.

Figure 3:
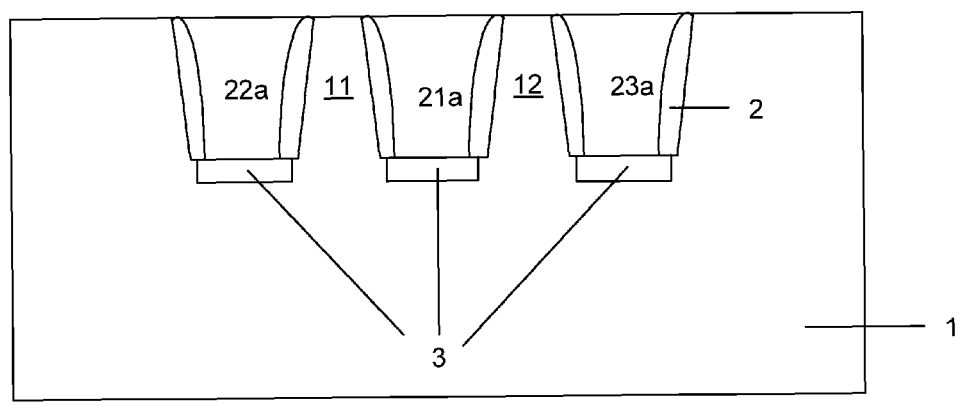
FIGS. 3 to 7 schematically illustrate structures of the parasitic lateral PNP transistor in respective steps of a manufacturing method according to an embodiment of the present invention.

Step 1: as shown in FIG. 3, a P-type silicon substrate 1 is etched to form three shallow trenches therein which isolate two adjacent active regions, namely a first active region 11 and a second active region 12. Among these three shallow trenches, the one located between the first active region 11 and the second active region 12 is a first shallow trench 21a, and those located on the outer sides of the first active region 11 and the second active region 12 are a second shallow trench 22a and a third shallow trench 23a, respectively.

Step 2: as shown in FIG. 3, after forming the shallow trenches, a first dielectric film 2 is deposited on the silicon substrate 1, which is an oxide film or a nitride film or a composite film consisted of an oxide film and a nitride film. Next, remove the portion of the first dielectric layer 2 over the bottom of each shallow trench by an etching process such that the remaining portion of the first dielectric layer 2 forms inner sidewalls over inner side faces of each shallow trench. After that, form a groove 3 by an over-etch process at the bottom of each shallow trench. The width of each groove is smaller than or equal to that of the bottom of its corresponding shallow trench, and the width of the groove is within the range from 0.05 µm to 0.3 µm.

Figure 4:
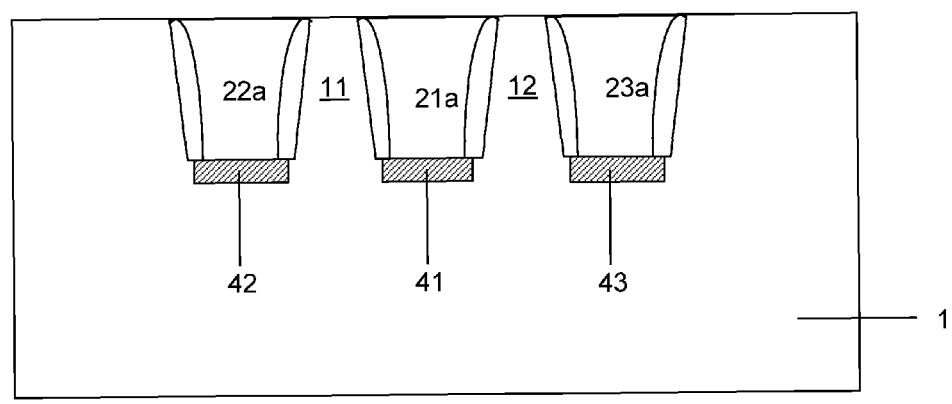

Step 3: as shown in FIG. 4, a polysilicon layer is selectively grown in each groove 3 until the thickness of the polysilicon layer is equal to the depth of the groove 3, such that the polysilicon layers completely fill the respective grooves 3 to form polysilicon pseudo buried layers 41 to 43.

Figure 5:
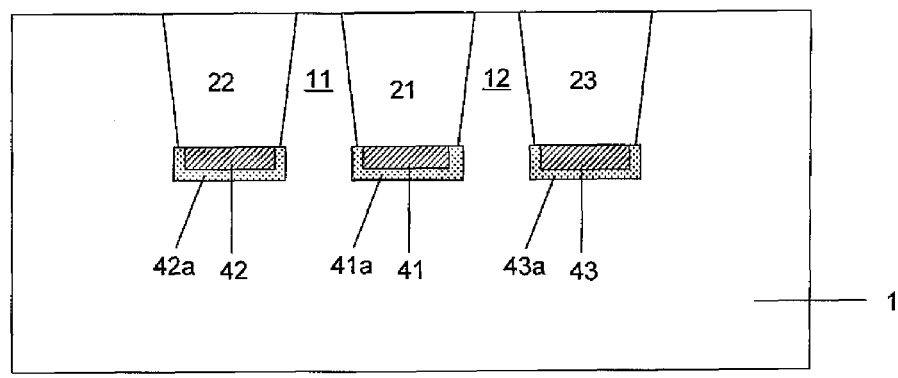

Step 4: as shown in FIG. 5, ions of a P-type impurity are implanted into the polysilicon pseudo buried layers 41 to 43 such that the P-type impurity ions further diffuses into respective boundary portions of the silicon substrate 1 that surround the polysilicon pseudo buried layers and thereby forms P-type doped regions 41a to 43a. The P-type impurity ions are implanted to form the P-type doped regions 41a to 43a under conditions as follows: the implantation dose is 5e14 cm$^{-2}$ to 5e15 cm$^{-2}$; the implantation energy is 3 KeV to 30 KeV; and the implanted impurity is boron or boron fluoride.

The polysilicon pseudo buried layer 41 and the P-type doped region 41a located under the first shallow trench 21a jointly form an emitter region. The polysilicon pseudo buried layer 42 and the P-type doped region 42a located under the second shallow trench 22a jointly form a first collector region, and the polysilicon pseudo buried layer 43 and the P-type doped region 43a located under the third shallow trench 23a jointly form a second collector region.

Step 5: as shown in FIG. 5, after removing the inner sidewalls in the shallow trenches, an oxide is filled into the first shallow trench 21a, the second shallow trench 22a and the third shallow trench 23a to form a first shallow trench field oxide region 21, a second shallow trench field oxide region 22 and a third shallow trench field oxide region 23, respectively.

Figure 6:
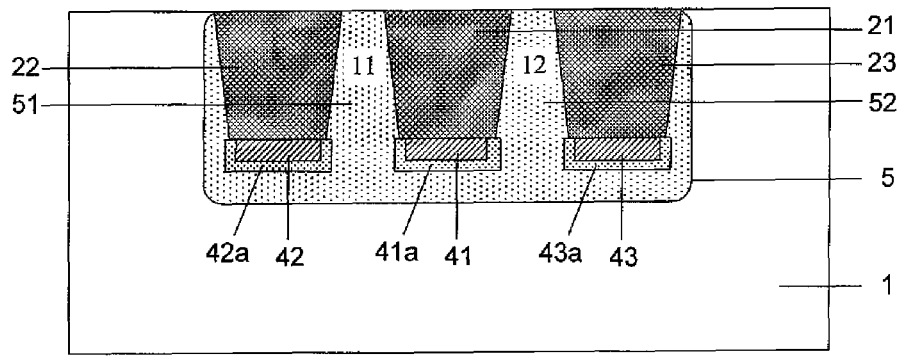

Step 6: as shown in FIG. 6, ions of an N-type impurity are implanted into the active regions 11 and 12 to form an N-type implanted layer 5. The N-type implanted layer 5 may be formed by using the collector ion implantation process or the N-type well ion implantation process of the NPN transistor process under conditions as follows: the implantation dose is 1e11 cm$^{-2}$ to 1e13 cm$^{-2}$; the implantation energy is 200 KeV to 1000 KeV; and the implanted N-type impurity is phosphorus or arsenic.

The N-type implanted regions respectively formed in the first active region 11 and the second active region 12 have a depth greater than that of the shallow trench field oxide regions, and laterally extend under the bottoms of the first shallow trench field oxide region 21, the second shallow trench field oxide region 22 and the third shallow trench field oxide region 23 and thereby are joined together into one layer. Portions of the N-type implanted layer located in the first active region 11 and the second active region 12 form the base regions 51 and 52, respectively, and the portion of the N-type implanted layer located under the base regions 51 and 52 surrounds and contacts with both the collector regions and the emitter region.

Figure 7:
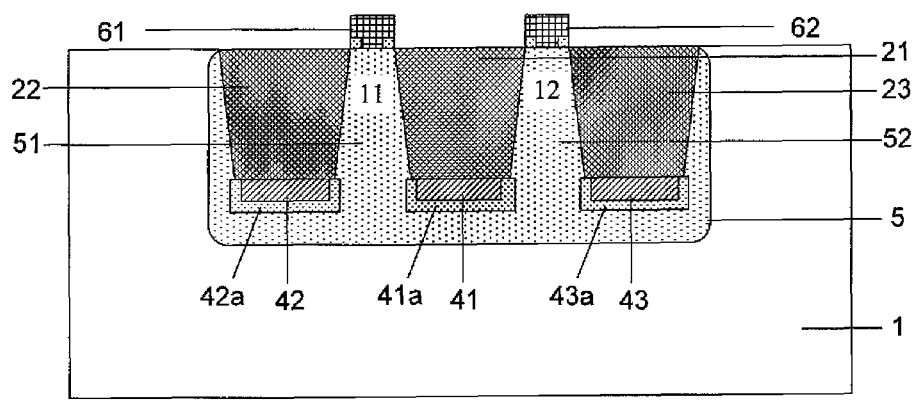

Step 7: as shown in FIG. 7, an N-type polysilicon layer is formed on the top of each active region, including a first N-type polysilicon layer 61 formed on the top of the first active region 11 and a second N-type polysilicon layer 62 formed on the top of the second active region 12. The N-type polysilicon layers 61 and 62 may be formed by using the emitter polysilicon process of the NPN transistor process. The impurity doped to form the N-type polysilicon layers 61 and 62 is phosphorus or arsenic, which may be implanted by an in-situ doping process or by first growing a non-doped polysilicon layer and then doping it by an ion implantation process. The implantation dose for forming the N-type polysilicon layers 61 and 62 is 1e15 $cm^{-2}$ to 1e16 $cm^{-2}$.

Step 8: as shown in FIG. 2, a metal silicide 7 is formed on the surfaces of the N-type polysilicon layers 61 and 62, and an interlayer film 8 for isolating the device from a subsequently formed metal layer is formed on the surface of the silicon substrate 1. Metal contacts 10 are formed on the tops of the first N-type polysilicon layer 61 and the second N-type polysilicon layer 62 to pick up a first base and a second base, respectively. Deep hole contacts 9 are formed in the shallow trench field oxide regions that are located on the tops of respective polysilicon pseudo buried layers, among which, the deep hole contact 9 formed in the first shallow trench field oxide region 21 contacts with the emitter region and picks up an emitter; the deep hole contact 9 formed in the second shallow trench field oxide region 22 contacts with the first collector region and picks up a first collector; and the deep hole contact 9 formed in the third shallow trench field oxide region 23 contacts with the second collector region and picks up a second collector. At last, a metal wire 13 is formed to enable the connection of the emitter, base and collector.

While specific embodiments have been presented in the foregoing description for the purpose of describing the invention, they are not intended to limit the invention in any way. Those skilled in the art can make various modifications and variations without departing from the spirit or scope of the invention. Thus, it is intended that the present invention embraces all such modifications and variations.

What is claimed is:

1. A parasitic lateral PNP transistor, comprising:
a P-type substrate;
three shallow trench field oxide regions formed in the substrate;
an N-type implanted layer formed beneath a top surface of the substrate and surrounding the three shallow trench field oxide regions, the N-type implanted layer including two portions each located between two adjacent ones of the three shallow trench field oxide regions and serving as a base region of the parasitic lateral PNP transistor;
two N-type polysilicon layers formed on the top surface of the substrate and contacting with the two portions of the N-type implanted layer;
a polysilicon pseudo buried layer formed under a bottom of each of the shallow trench field oxide regions and including a P-type impurity;
a P-type doped region, formed around each polysilicon pseudo buried layer; wherein each P-type doped region is surrounded by and contacting with the N-type implanted layer,
wherein the polysilicon pseudo buried layer and the P-type doped region under a bottom of a middle one of the three shallow trench field oxide regions jointly serve as an emitter region of the parasitic lateral PNP transistor, and the polysilicon pseudo buried layer and the P-type doped region under a bottom of each of the shallow trench field oxide regions adjacent to the middle shallow trench field oxide region jointly serve as a collector region of the parasitic lateral PNP transistor.

2. The parasitic lateral PNP transistor according to claim 1, wherein a width of the polysilicon pseudo buried layer is smaller than or equal to that of the bottom of the shallow trench field oxide region, and the width of the polysilicon pseudo buried layer is 0.05 μm to 0.3 μm.

3. The parasitic lateral PNP transistor according to claim 1, wherein a depth of the bottom of the shallow trench field oxide region is 0.3 μm to 0.5 μm.

4. The parasitic lateral PNP transistor according to claim 1, wherein a distance between the emitter region and each of the collector regions is 0.4 μm to 2 μm.

5. The parasitic lateral PNP transistor according to claim 1, further comprising:
a metal contact formed on a top of each N-type polysilicon layer to pick up a base;
a first deep hole contact formed in the shallow trench field oxide region that is located on a top of the emitter region, the first deep hole contact contacting with the emitter region to pick up an emitter; and
a second deep hole contact formed in each of the shallow trench field oxide regions that are located on top of the collector regions, the second deep hole contact contacting with the corresponding collector region to pick up a collector.

6. A method of manufacturing a parasitic lateral PNP transistor, comprising:
providing a P-type substrate;
etching the P-type substrate to form three shallow trenches therein;
forming a groove at a bottom of each of the three shallow trenches;
filling polysilicon into each groove to form a polysilicon pseudo buried layer therein;
implanting a P-type impurity into each polysilicon pseudo buried layer and causing the implanted P-type impurity to diffuse such that a P-type doped region is formed around each polysilicon pseudo buried layer, wherein the polysilicon pseudo buried layer and the P-type doped region under a bottom of a middle one of the three trenches jointly serve as an emitter region of the parasitic lateral PNP transistor, and the polysilicon pseudo buried layer and the P-type doped region under a bottom of each of the shallow trenches adjacent to the middle shallow trench jointly serve as a collector region of the parasitic lateral PNP transistor;
filling an oxide into each of the shallow trenches to form a shallow trench field oxide region therein;
implanting an N-type impurity into the substrate and causing the implanted N-type impurity to diffuse so as to form an N-type implanted layer beneath a top surface of the substrate and surrounding the three shallow trenches and the polysilicon pseudo buried layer and the P-type doped region under each shallow trench, wherein two portions of the N-type implanted layer each located between two adjacent ones of the three shallow trenches serve as two base regions of the parasitic lateral PNP transistor; and
forming an N-type polysilicon layer on the top surface of the substrate and contacting with the two portions of the N-type implanted layer.

7. The method according to claim 6, further comprising:

forming a metal contact on a top of each N-type polysilicon layer to pick up a base;

forming a first deep hole contact in the shallow trench field oxide region that is located on a top of the emitter region, the first deep hole contact contacting with the emitter region to pick up an emitter; and forming a second deep hole contact in each of the shallow trench field oxide regions that are located on top of the collector regions, the second deep hole contact contacting with the corresponding collector region to pick up a collector.

8. The method according to claim 6, wherein forming a groove at a bottom of each of the shallow trenches comprises:

depositing a first dielectric layer on the top surface of the P-type substrate;

removing a portion of the first dielectric layer formed over a bottom of each shallow trench by using an etching process such that the remaining portion of the first dielectric layer forms inner sidewalls over inner side faces of each shallow trench; and forming a groove at the bottom of each shallow trench by an over-etch process to the P-type substrate.

9. The method according to claim 8, further comprising removing the inner sidewalls prior to filling an oxide into each of the shallow trenches.

10. The method according to claim 8, wherein the first dielectric layer is an oxide film or a nitride film or a composite film consisting of an oxide film and a nitride film.

11. The method according to claim 6, wherein a width of the groove is smaller than or equal to that of the bottom of the shallow trench, and the width of the groove is 0.05 μm to 0.3 μm.

12. The method according to claim 6, wherein the P-type impurity is implanted with an implantation dose of $5e14\ cm^{-2}$ to $5e15\ cm^{-2}$ and an implantation energy of 3 KeV to 30 KeV, and the P-type impurity is boron or boron fluoride.

13. The method according to claim 6, wherein the N-type impurity is implanted with an implantation dose of $1e11\ cm^{-2}$ to $1e13\ cm^{-2}$ and an implantation energy of 200 KeV to 1000 KeV, and the N-type impurity is phosphorus or arsenic.

14. The method according to claim 6, wherein the N-type polysilicon layer is formed by in-situ doping.

15. The method according to claim 6, wherein the N-type polysilicon layer is formed by first growing a non-doped polysilicon layer and then doping it by ion implantation with an implantation dose of $1e15\ cm^{-2}$ to $1e16\ cm^{-2}$.

* * * * *